(12) United States Patent
Chinthakindi et al.

(10) Patent No.: US 7,608,909 B2
(45) Date of Patent: Oct. 27, 2009

(54) SUSPENDED TRANSMISSION LINE STRUCTURES IN BACK END OF LINE PROCESSING

(75) Inventors: Anil K. Chinthakindi, Poughkeepsie, NY (US); Robert A. Groves, Highland, NY (US); Youri V. Tretiakov, South Burlington, VT (US); Kunal Vaed, Poughkeepsie, NY (US); Richard P. Volant, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 232 days.

(21) Appl. No.: 11/164,765

(22) Filed: Dec. 5, 2005

(65) Prior Publication Data

US 2006/0197119 A1    Sep. 7, 2006

Related U.S. Application Data

(62) Division of application No. 10/709,357, filed on Apr. 29, 2004, now Pat. No. 7,005,371.

(51) Int. Cl.
    *H01L 21/76* (2006.01)
(52) U.S. Cl. ............... 257/522; 438/411; 257/E23.013; 257/E21.373
(58) Field of Classification Search .................. 257/259, 257/52, E23.013, E21.373; 438/618, 167
    See application file for complete search history.

(56) References Cited

U.S. PATENT DOCUMENTS

| | | | |
|---|---|---|---|
| 6,060,756 A | 5/2000 | Machida et al. | |
| 6,175,727 B1 | 1/2001 | Mostov | |
| 6,258,688 B1 | 7/2001 | Tsai | |
| 6,377,156 B2 | 4/2002 | Farrar et al. | |
| 6,472,257 B2 | 10/2002 | Ferrari et al. | |
| 6,495,445 B2 | 12/2002 | Clevenger et al. | |
| 6,495,903 B2 | 12/2002 | Xu et al. | |
| 6,504,109 B1 | 1/2003 | Aval et al. | |
| 6,534,843 B2 | 3/2003 | Acosta et al. | |

(Continued)

OTHER PUBLICATIONS

A. Joshi, R. Nimmagadda; "Erosion of diamond films and graphite in oxygen plasma;" Journal of Materials in Research vol. 6, No. 7, p. 1484; 1996.

(Continued)

*Primary Examiner*—Thao X Le
*Assistant Examiner*—Ajay K Arora
(74) *Attorney, Agent, or Firm*—Cantor Colburn LLP; Lisa Jaklitsch

(57) ABSTRACT

A method for forming a transmission line structure for a semiconductor device includes forming an interlevel dielectric layer over a first metallization level, removing a portion of the interlevel dielectric layer and forming a sacrificial material within one or more voids created by the removal of the portion of the interlevel dielectric layer. A signal transmission line is formed in a second metallization level formed over the interlevel dielectric layer, the signal transmission line being disposed over the sacrificial material. A portion of dielectric material included within the second metallization level is removed so as to expose the sacrificial material, wherein a portion of the sacrificial material is exposed through a plurality of access holes formed through the signal transmission line. The sacrificial material is removed so as to create an air gap beneath the signal transmission line.

9 Claims, 19 Drawing Sheets

U.S. PATENT DOCUMENTS

| | | | |
|---|---|---|---|
| 6,555,467 B2 * | 4/2003 | Hsu et al. | 438/633 |
| 6,573,600 B2 * | 6/2003 | Kikuchi et al. | 257/750 |
| 6,597,068 B2 | 7/2003 | Petrarca et al. | |
| 6,635,506 B2 | 10/2003 | Volant et al. | |
| 6,913,946 B2 * | 7/2005 | Lin | 438/106 |
| 2004/0014273 A1 | 1/2004 | Bhattacharyya et al. | |
| 2004/0028888 A1 | 2/2004 | Lee et al. | |

OTHER PUBLICATIONS

D. Bhusari, H. A. Reed, M. Wedlake, A. M. Padovani, S. A. Bidstrup Allen, and P. A. Kohl; "Fabrication of Air-Channel Structures for Microfluidic, Microelectromechanical, and Microelectronic Applications;" Journal of Microelectromechanical Systems, vol. 10, No. 3; Sep. 2001; pp. 400-408.

* cited by examiner

SUSPENDED TRANSMISSION LINE STRUCTURES IN BACK END OF LINE PROCESSING

CROSS REFERENCE TO RELATED APPLICATIONS

This application is a divisional application of U.S. Ser. No. 10/709,357, filed Apr 29, 2004, now U.S. Pat. No. 7,005,371, the contents of which are incorporated by reference herein in their entirety.

BACKGROUND OF THE INVENTION

The present invention relates generally to semiconductor manufacturing processes and, more particularly, to a method for forming suspended transmission line structures in back end of line (BEOL) processing of semiconductor devices.

Semiconductor integrated circuits typically are formed by MOS (metal oxide semiconductor) or by bipolar transistors that are integrated at a top planar major surface of a silicon chip. Electrical interconnections between various transistors, as well as between certain transistors and access pins located along the periphery of the chip, have typically taken the form of two (or more) "levels" of interconnections, i.e., electrically conducting lines in the form of metallization stripes running along two (or more) essentially planar surfaces that are oriented mutually parallel to, and are insulated from, both each other and the top planar surface of the chip by suitable insulating layers. Interconnection vias (windows) in the insulating layers are provided wherever needed in accordance with the desired circuit interconnections.

In particular, microstrip structures are used primarily in radio frequency (RF) CMOS/SiGe chips, where wiring is not dense. Generally, microstrip structures provide fairly good isolation of the signal from lossy substrate material underneath. As illustrated in FIG. 1(a), a typical microstrip transmission line structure 10 includes a signal transmission line 12, an underlying ground plane 14 for shielding, and an interlayer dielectric material (ILD) 16 therebetween. Since the shielding 14 and signal transmission line 12 are fabricated as standard interconnect components, they are encapsulated by the dielectric material 16. Examples of such dielectric material include, for example, silicon dioxide ($SiO_2$), SiCOH, SiLK, FSG, USG, among others. The dielectric constant of such materials generally ranges from about 2.5 to about 4.1.

On the other hand, coplanar waveguides are commonly used where wiring density is relatively high, such as in CMOS chips, for example, where it is difficult to create an explicit return path below the signal line. The only way to reliably return the signal is to also use the same routing metal level as the one used for the signal wire. Thus, as shown in FIG. 1(b), a typical coplanar waveguide transmission line structure 20 includes a signal transmission line 22 and two adjacent shielding lines 24 disposed on the same wiring level as the transmission line 22. The coplanar waveguide structure 20 is at a fixed distance from the silicon substrate 26. A third structure referred to as a microstrip transmission line having side shielding (i.e., having characteristics of both microstrip and coplanar structures) has also been used in existing transmission line structures.

As shown in FIG. 1(c), a typical microstrip transmission structure 30 with side shielding includes a signal transmission line 32, a ground plane 34 for shielding, and an interlayer dielectric material 36 therebetween. In addition, however, the shielding also includes shielding lines 38 disposed on the same wiring level as the signal transmission line 32. The shielding lines 38 are electrically contiguous with the ground plane 34 through conductively filled vias 40. As with the microstrip structure 10, the conventional coplanar elements are also surrounded by ILD material.

In each instance, the use of the ILD material as described above generates dielectric losses and reduces the Q-factor of the transmission lines in the BEOL interconnect. Accordingly, it would be desirable to create such shielded transmission line structures in conjunction with a lower dielectric material so as to improve the performance of the transmission lines.

BRIEF DESCRIPTION OF THE INVENTION

The foregoing discussed drawbacks and deficiencies of the prior art are overcome or alleviated by a method for forming a transmission line structure for a semiconductor device. In an exemplary embodiment, the method includes forming an interlevel dielectric layer over a first metallization level, removing a portion of the interlevel dielectric layer and forming a sacrificial material within one or more voids created by the removal of the portion of the interlevel dielectric layer. A signal transmission line is formed in a second metallization level formed over the interlevel dielectric layer, the signal transmission line being disposed over the sacrificial material. A portion of dielectric material included within the second metallization level is removed so as to expose the sacrificial material, wherein a portion of the sacrificial material is exposed through a plurality of access holes formed through the signal transmission line. The sacrificial material is removed so as to create an air gap beneath the signal transmission line.

In another embodiment, a back end of line transmission line structure for a semiconductor device includes an interlevel dielectric layer formed over a first metallization level, and one or more voids formed in the interlevel dielectric layer. A signal transmission line is formed in a second metallization level, the signal transmission line being disposed over the one or more voids. The signal transmission line further includes a plurality of access holes formed therethrough to provide removal access to a sacrificial material used to define the one or more voids, wherein the one or more voids define an air gap beneath the signal transmission line.

In still another embodiment, a back end of line microstrip transmission line structure includes a signal transmission line formed on one metallization level and a ground plane formed on another metallization level. An air gap is disposed between the signal transmission line and the ground plane, the air gap formed within an interlevel dielectric layer. One of the signal transmission line and the ground plane further includes a plurality of access holes formed therethrough to provide removal access to a sacrificial material used to define the air gap.

In still another embodiment, a back end of line coplanar waveguide transmission line structure includes a signal transmission line formed on a first metallization level, and a pair of coplanar shielding lines adjacent the signal transmission line in the first metallization level. An air gap is disposed beneath the signal transmission line, the air gap formed within an interlevel dielectric layer. The signal transmission line further includes a plurality of access holes formed therethrough to provide removal access to a sacrificial material used to define the air gap.

BRIEF DESCRIPTION OF THE DRAWINGS

Referring to the exemplary drawings wherein like elements are numbered alike in the several Figures.

DETAILED DESCRIPTION OF THE INVENTION

Disclosed herein is a method for forming suspended transmission line structures in back end of line (BEOL) semiconductor processing, in which the integration scheme results in copper BEOL transmission line structures with lower dielectric losses. It will be appreciated, however, that the method embodiments described herein are not limited to copper BEOL as such, and can be extended to other interconnects fabricated using various materials including for example, but not limited to, aluminum, tungsten, gold. In one embodiment, the integration method results in the formation of an air gap between a signal line and a ground plane so as to reduce the interconnect dielectric constant and thus the amount of capacitive cross-talk, which can be particularly high at microwave frequencies. Furthermore, the term "air gap" as used hereinafter is not necessarily limited to the presence of air between a signal line and ground plane, but is also intended to describe or refers to the presence of any gaseous phase material, or a vacuum.

Figure 1A:
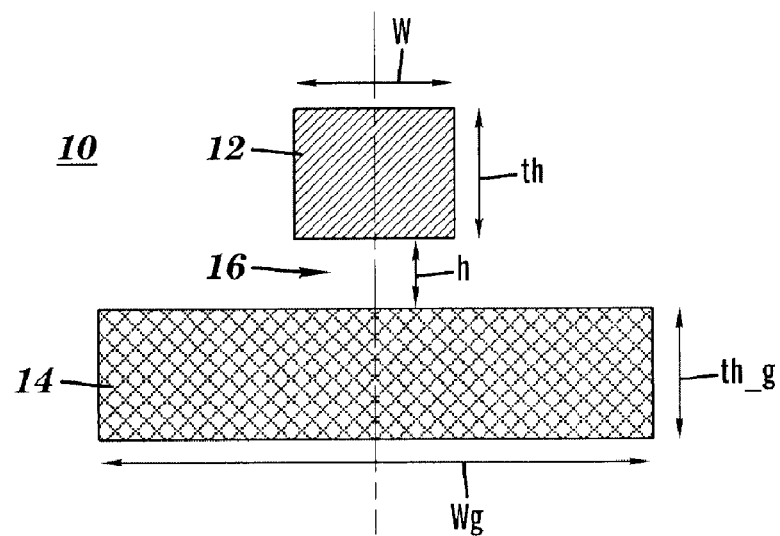
FIG. 1(a) is a cross-sectional view of a conventional microstrip transmission line structure.
Figure 1B:
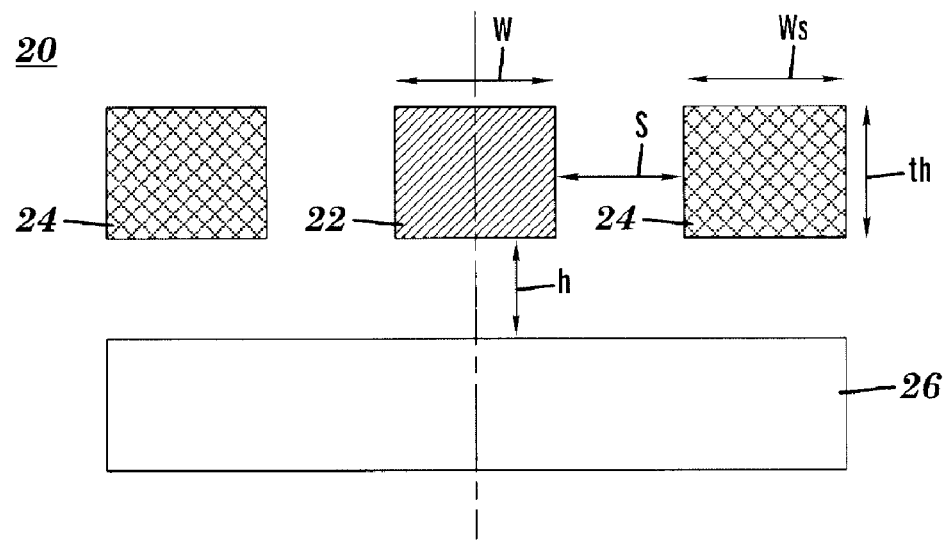
FIG. 1(b) is a cross-sectional view of a conventional coplanar waveguide transmission line structure.
Figure 1C:
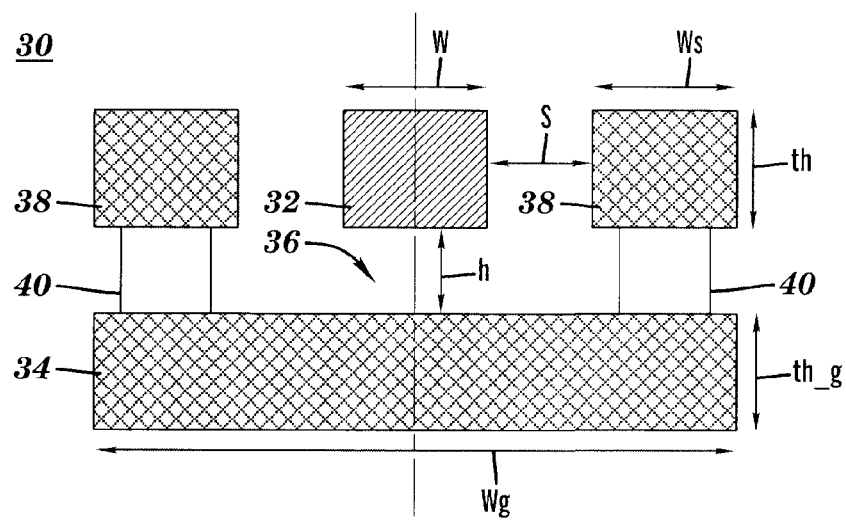
FIG. 1(c) is a cross-sectional view of a conventional microstrip transmission line structure with side shielding.
Figure 2A:
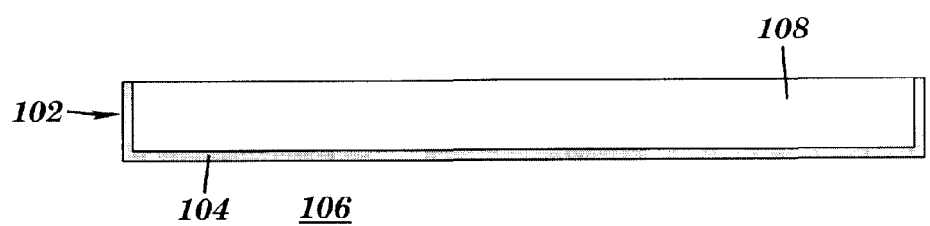
FIGS. 2(a) through 2(i) are a series of process flow diagrams illustrating a method for forming a suspended transmission line structure in back end of line (BEOL) processing, in accordance with an embodiment of the invention.
Figure 2B:
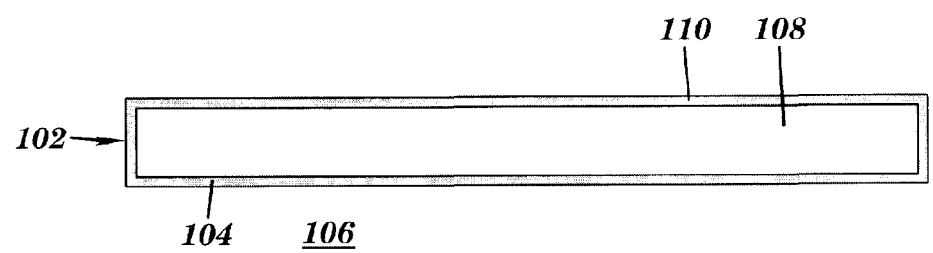

Referring generally now to FIGS. 2(a) through 2(i), there is shown a series of process flow diagrams illustrating a method for forming a suspended transmission line structure in back end of line (BEOL) processing, in accordance with an embodiment of the invention. Beginning in FIG. 2(a), a ground plane 102 is formed through single damascene processing techniques. In particular, a liner material 104 (e.g., tantalum nitride/tantalum) is deposited within an opening formed in an insulating layer 106, after which the BEOL metallization 108 (e.g., copper) is deposited over the liner material by (for example) electroplating, sputtering, etc., and thereafter planarized. As shown in FIG. 2(b), the ground plane 102 is thereafter completely encapsulated by recess etching a portion of the BEOL metallization 108, depositing additional liner material and planarizing to form a top liner portion 110. Thus encapsulated, the ground plane 102 is resistant to diffusion of atoms of the metallization 108, as well as to oxidation from subsequent processing steps described hereinafter.

In an exemplary embodiment, the top surface of the wiring 108 is recessed with respect to the top layer of dielectric layer 106. One method for recessing the metal is to use a timed wet etch to achieve the desired depth. For example, a solution comprised of water, acetic acid and hydrogen peroxide (of an exemplary concentration of 3 liters, 15 ml, and 9 ml, respectively) is applied for about 2.5 minutes to achieve a depth of about 600 Angstroms (Å) to about 800 Å. The layer of barrier material 110 is then deposited, and is used to encapsulate the copper to protect it during subsequent processing. One particular embodiment incorporates a layer 100 Å thick of tantalum (Ta), followed by 400 Å of tantalum nitride (TaN). Alternatively, the barrier material 110 could also be made of a dielectric or any number of other suitable metallic barriers.

Still another method of encapsulating the metallization is to pattern the blanket barrier 110 using the same mask for defining the conductors, along with the opposite polarity photoresist and then etching the barrier layer from the upper most surface. Other materials that may be used for encapsulating the interconnects include cobalt-tungsten-phosphorus (CoWP) and Ni—Au alloys, which may be deposited by electroplating and electroless plating, among other methods.

Figure 2C:
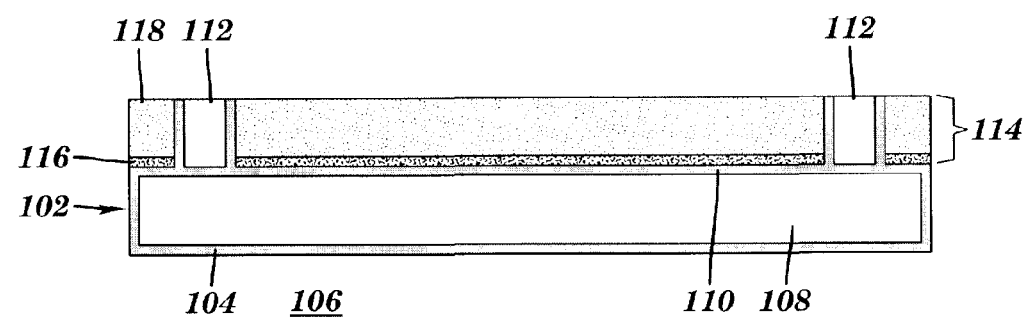

FIG. 2(c) illustrates the formation of vias 112 within an interlevel (ILD) layer 114, in accordance with a coplanar transmission line embodiment. The ILD layer 114 may include, for example, a silicon nitride ($Si_3N_4$) layer 116 followed by a thicker $SiO_2$ layer 118, which is thereafter lithographically patterned for via definition. Then, the liner and metallization materials are formed within the openings and planarized as known in the art to form the filled vias 112.

Figure 2D:
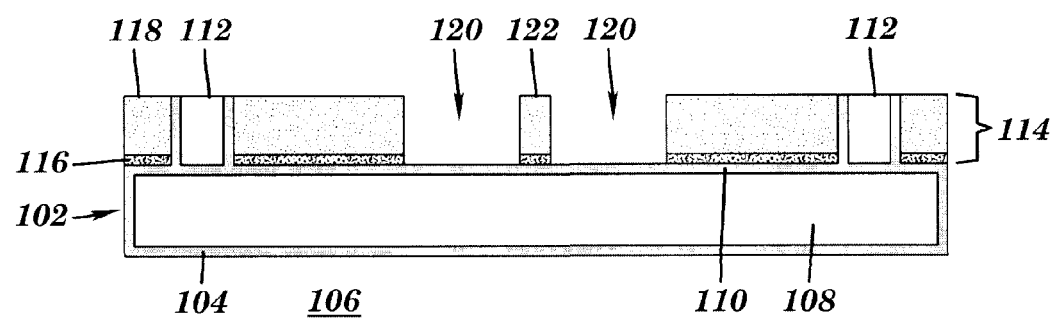
Figure 2E:
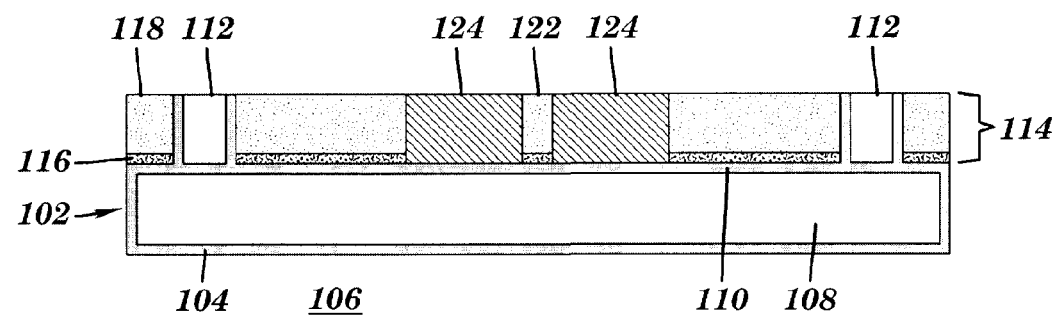

Referring to FIG. 2(d), parallel trenches 120 are formed within the ILD layer 114 between vias 112. Alternatively, the original nitride layer 116 may be left at the bottom of the trenches 120 to seal and protect the ground plane as discussed above. The trenches are disposed so as to create an insulating support member 122 therebetween. The lithographic patterning in this step may be designed such that support member 122 is a continuous rail running the length of the ground plane 102 or, alternatively, such that support member is a plurality of individual posts disposed along the length of the ground plane 102. In other words, if a post configuration is desired for support member 122, then the trenches 120 are "connected" to one another at various locations along the length of the ground plane 102 (i.e., looking into the Figure). It should further be appreciated that the support member 122 may also be configured as two or more parallel rails or series of individual posts. Then, in FIG. 2(e), a sacrificial material 124 is formed and planarized within the trenches. The sacrificial material 124 may be, for example, an organic low-k dielectric polymer, chosen so as to be subsequently selectively removable with respect to the ILD layers and the BEOL metallization material.

Some exemplary materials that may be used as the sacrificial material are SiLK®, diamond-like carbon (DLC) and polynorbornene (PNB). SiLK® is a semiconductor dielectric manufactured by Dow Chemical Corp., and is available under various formulations of the product, such as Porous SiLK®. This particular dielectric is a polymer resin comprised of gamma-butyrolactone, proprietary B-staged polymer and mesitylene. Another material which may be employed for this purpose is DLC, which is an amorphous carbon containing coating wherein a proportion of the carbon atoms are bonded in a manner that is similar to diamond. These materials may be removed by way of oxygen plasma exposure, so long as there is no oxidizable material that is exposed. If there is an oxidizable material that will be exposed during the removal of the organic material, a $H_2/CO_2/CO/N_2$ type plasma removal process could be used. These gas mixtures will be recognizable to practitioners skilled in the art of reactive ion etching. Polynorbornene is a sacrificial polymer that thermally decomposes at about 400-425° C. Hence, a simple thermal treatment may be employed to remove the sacrificial material.

Figure 2F:
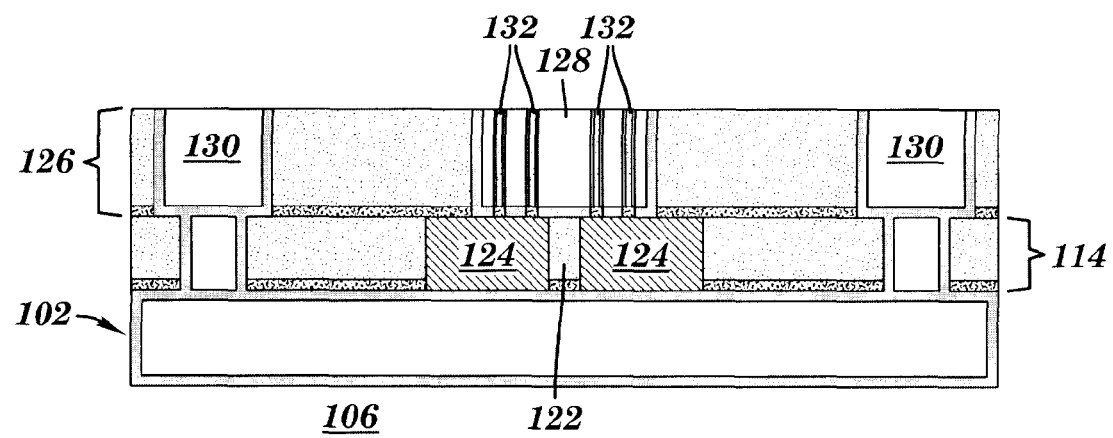

FIG. 2(f) illustrates the formation of the signal level metallization structures. As is shown, another dielectric layer 126 is formed over ILD layer 114, after which openings are defined therein for the formation of signal transmission line 128 and coplanar shielding lines 130. However, it can be seen that the patterning for the signal transmission line is implemented in a manner as to leave a plurality of plugs 132 of the dielectric layer 126. Thus, when the liner and metallization material is added for the coplanar shielding lines 130 and the signal transmission line 128, the resulting signal transmission line metallization is not completely continuous along the length thereof.

Figure 2G:
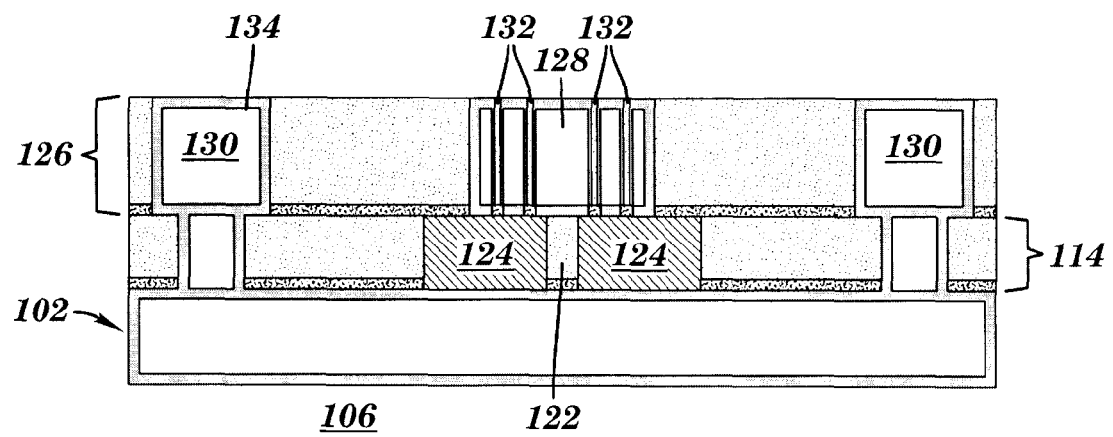
Figure 2H:
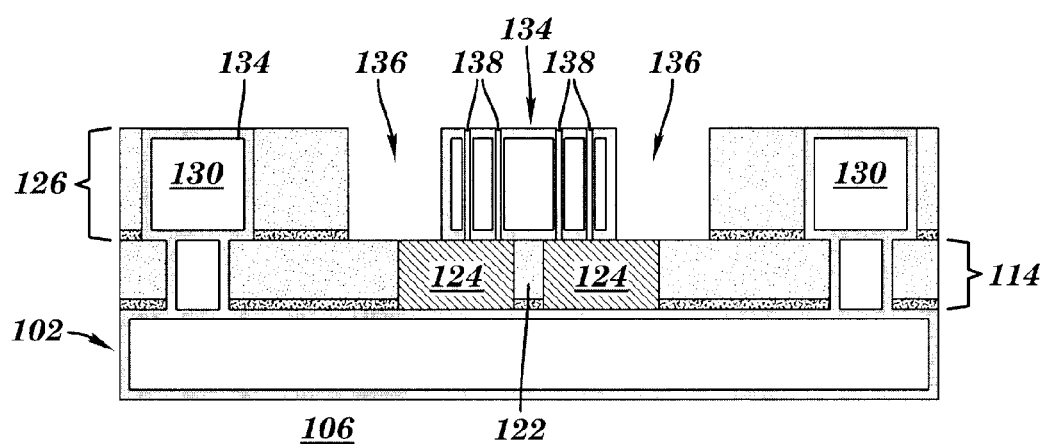
Figure 2I:
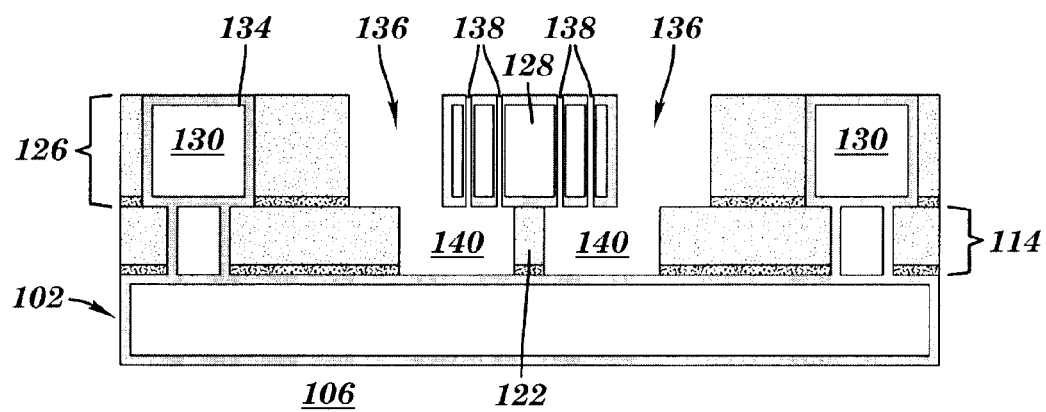

As was the case with the ground plane 102, a portion of the BEOL metallization for the signal transmission line 128 and coplanar shielding lines 132 is recessed etched in preparation for a top liner 134 formed thereover for encapsulating the signal level metallization structures. This is shown in FIG. 2(g). In FIG. 2(h), another patterning step is implemented in order to remove a portion of dielectric layer 126 adjacent each side of signal transmission line 128 so as to create voids 136 that expose the outer edges of the sacrificial material 124. In addition, the dielectric plugs 132 left after the patterning of the signal transmission line 128 are now also removed so as to form access holes 138. The combination of voids 136 and access holes 138 at various points along the signal transmission line 128 allow for the release of the sacrificial material 124 (e.g., by an $O_2$ plasma etch), as shown in FIG. 2(i).

When the selected sacrificial material is SiLK® or DLC, it is released by exposure to an oxygen or hydrogen plasma, which decomposes the material. Additional details regarding this process may be found in the publication by A. Joshi and R. Nimmagadda entitled "Erosion of diamond films and graphite in oxygen plasma", Journal of Material Research, Vol. 6, No. 7, p. 1484, 1996, published by the Materials Research Society, the contents of which are incorporated by reference herein in their entirety. For polynorbornene, a thermal treatment at 425° C. may be carried out to release the signal line. Additional details of this release process may be found in the paper by Dhananjay Bhusari et al., entitled "Fabrication of Air-Channel Structures for Microfluidic, Microelectromechanical, and Microelectronic Applications", Journal of Microelectromechanical Systems, Vol. 10, No.3, p. 400, 2001, the contents of which are incorporated by reference herein in their entirety. The resulting transmission line structure thus includes a low dielectric constant (air) gap 140 both underneath the signal transmission line 128 in the ILD 114 level, as well as adjacent the signal transmission line 128 in the signal level (by voids 136).

Figure 2J:
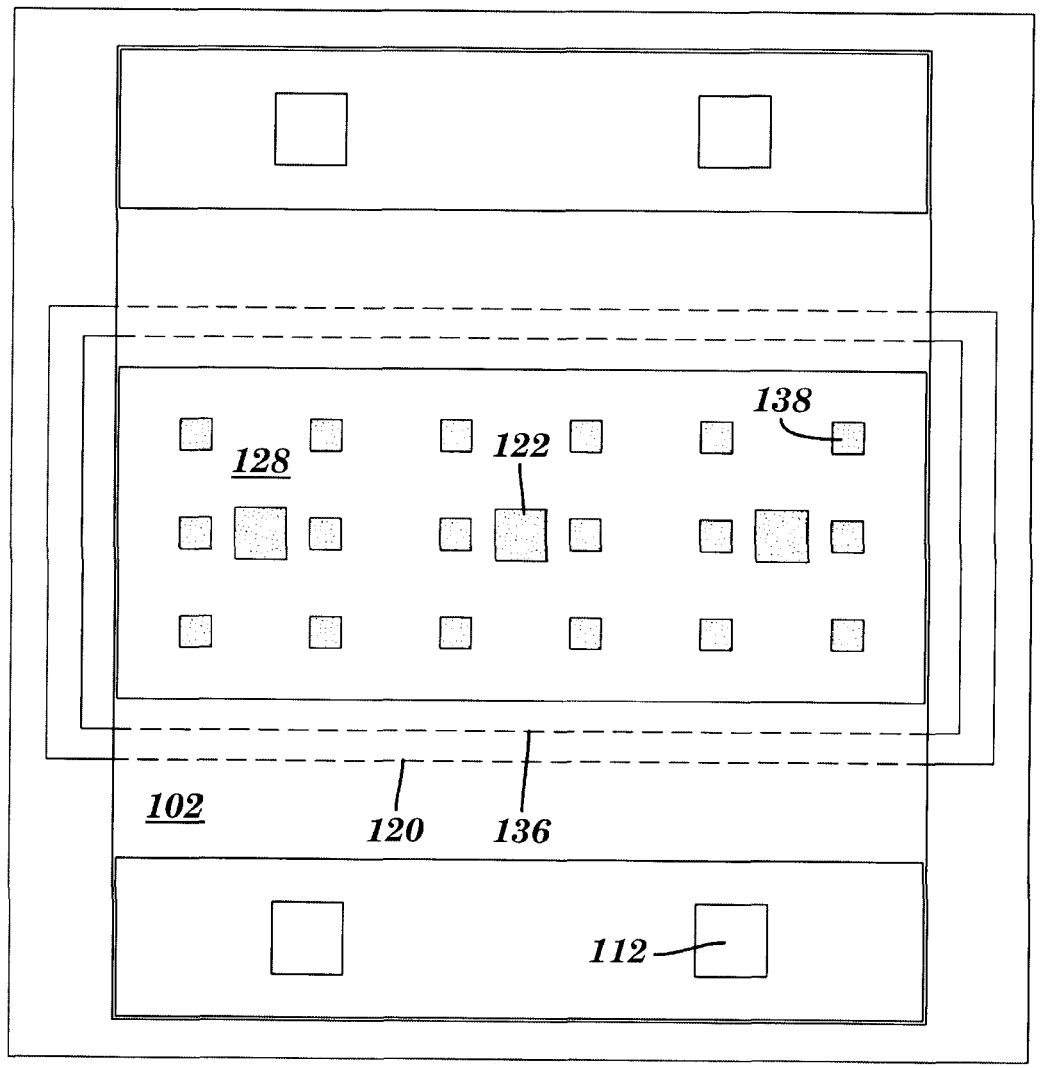
FIG. 2(j) is a plan (top-down) view of the design and mask layout of the resulting suspended transmission line structure formed in FIGS. 2(a) through 2(i)

FIG. 2(j) illustrates a top down (plan) view of the design and layout of the suspended transmission line structure. In the design of access holes 138, special consideration is given to the arrangement of the holes to allow for reliable signal propagation. In the embodiment of FIG. 2(j), an orthogonal arrangement of access holes, parallel to conductor edges, is implemented in order to minimize current disturbance. In addition, the size of the access holes 138 should be large enough to allow lateral etching of the sacrificial material, and yet small enough to cause minimal increase in signal line resistance.

After releasing the sacrificial material, one possible method for encapsulating the suspended transmission line structure is to deposit a sheet of polyimide or kapton (not shown) to completely cover the device. The layers of polyimide/kapton may then be patterned to make contact with the test pads as is necessary for further BEOL processing.

Figure 7A:
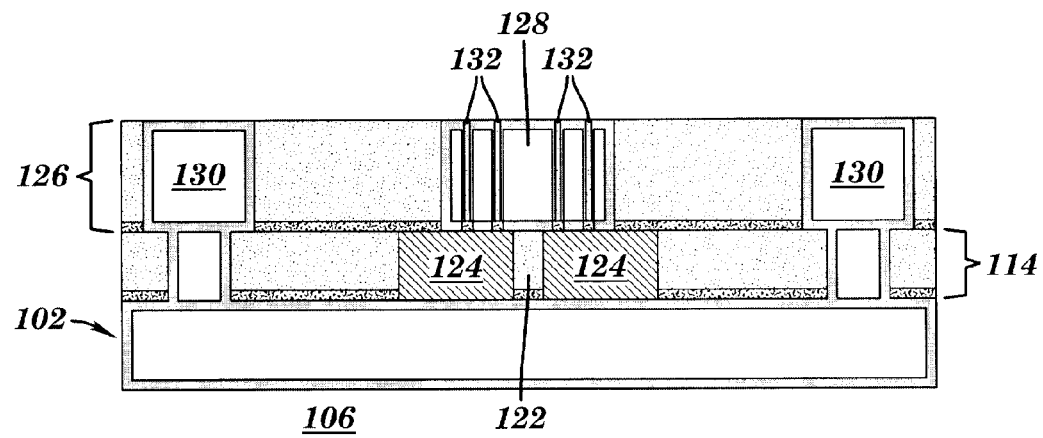
FIGS. 7(a) through 7(g) are a series of process flow diagrams illustrating one possible method for encapsulating a suspended transmission line structure as formed in FIGS. 2(a) through 2(g), in accordance with an embodiment of the invention.
Figure 7B:
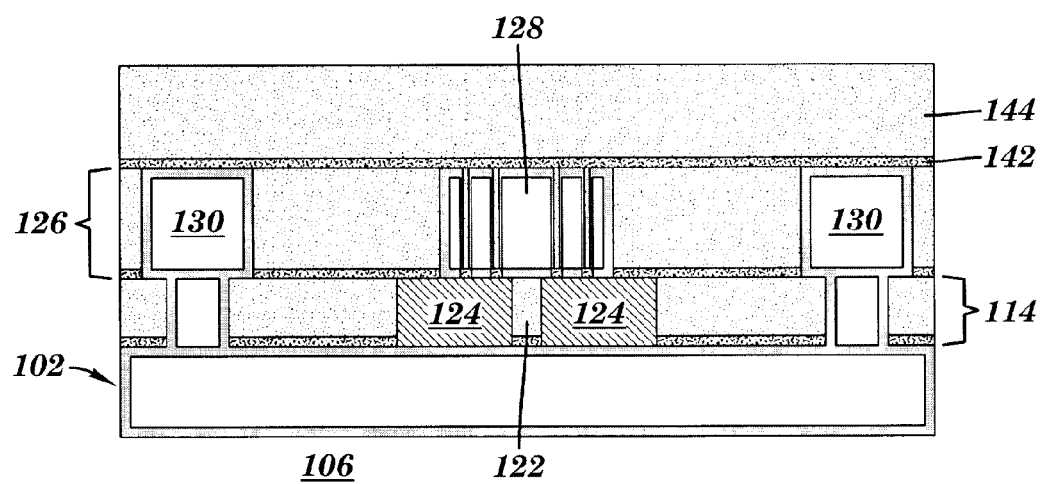
Figure 7C:
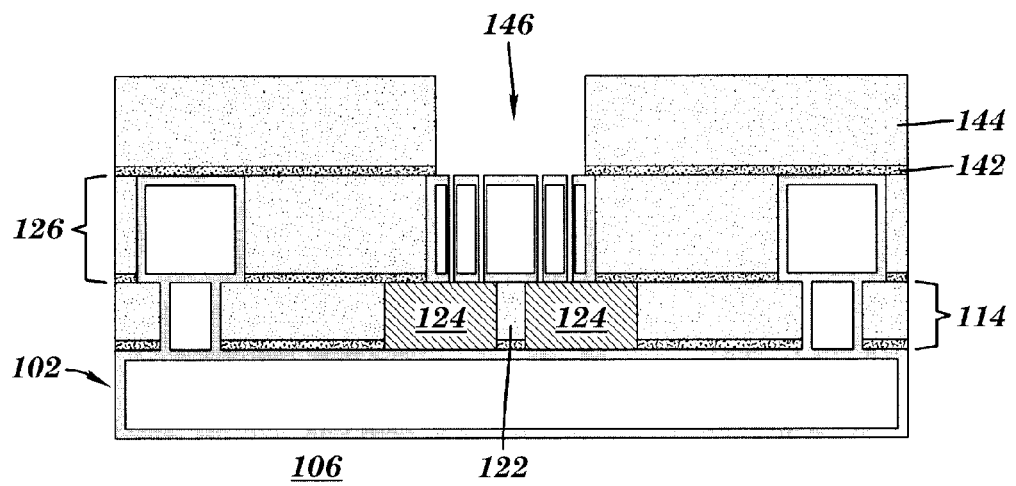

FIGS. 7(a) through 7(g) illustrate an alternate processing embodiment that may be implemented (beginning from the structure formed in FIG. 2(g) onward), and which will be also useful to describe how the suspended transmission line structure is encapsulated. In FIG. 7(b), dielectric layer 142 (preferably $Si_3N_4$) and ILD layer 144 (preferably $SiO_2$) are deposited on the signal line structure. As shown in FIG. 7(c), a cavity 146 is formed above the signal line 128 using lithographic patterning and etching steps. During the etching of this cavity, the dielectric material is also removed from the cavity area around the signal line 128 and through the release holes contained in the signal line 128.

Figure 7D:
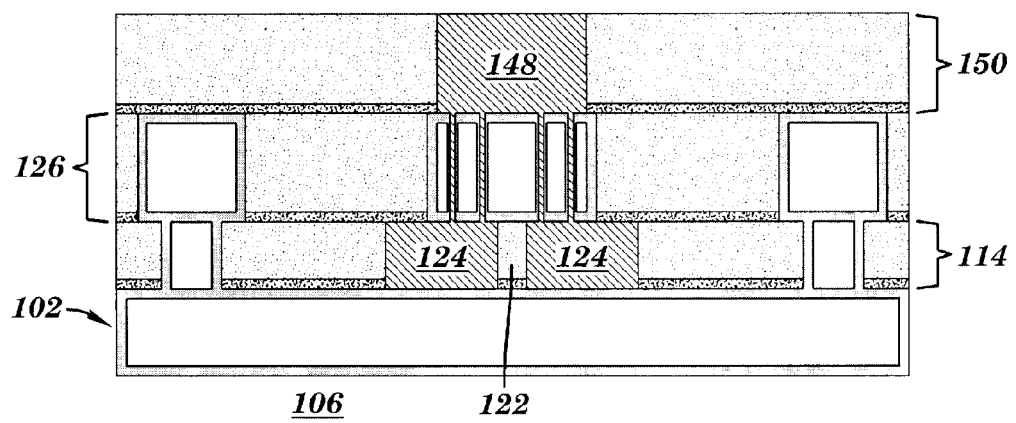
Figure 7E:
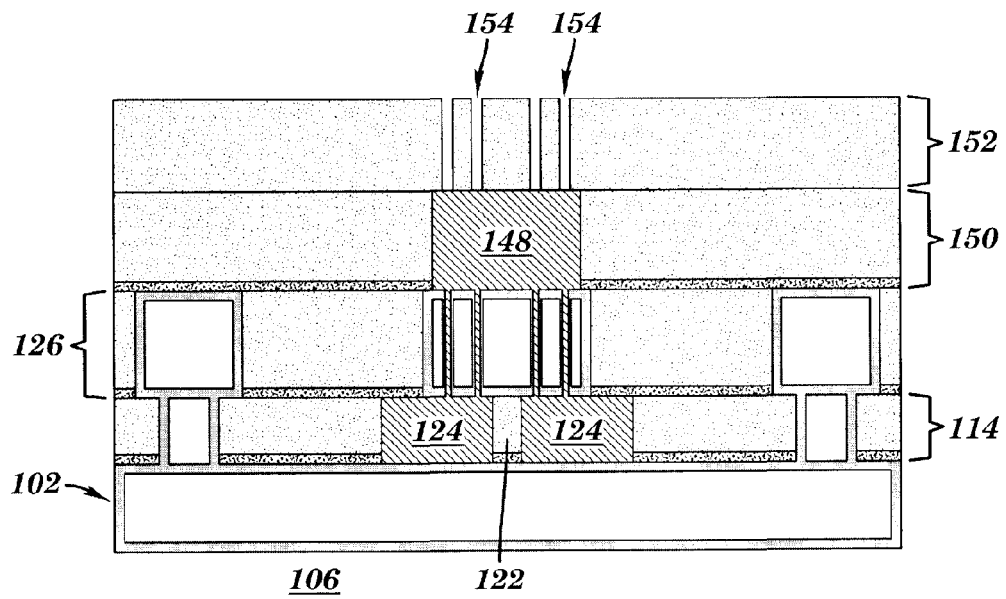
Figure 7F:
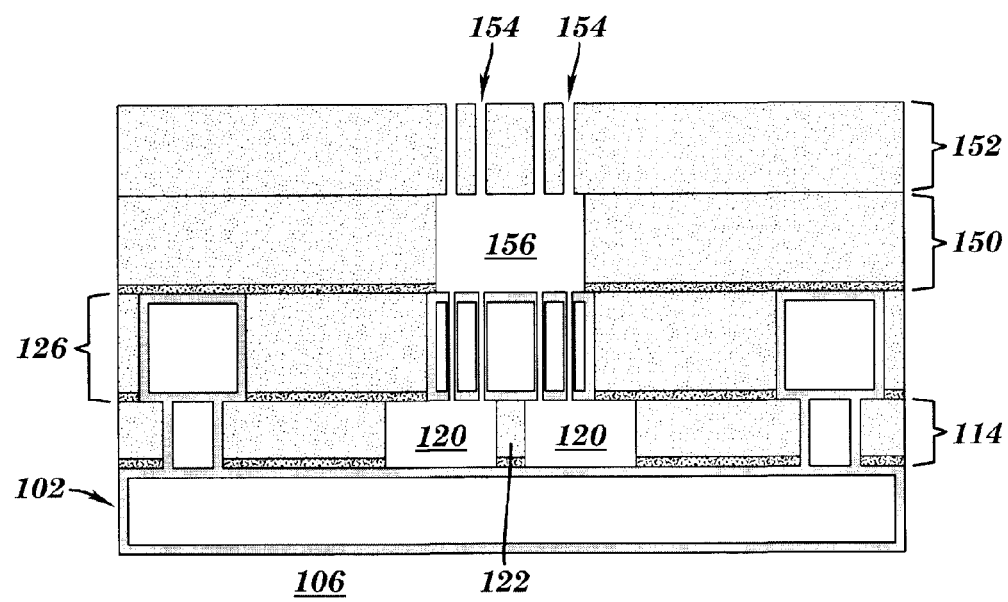
Figure 7G:
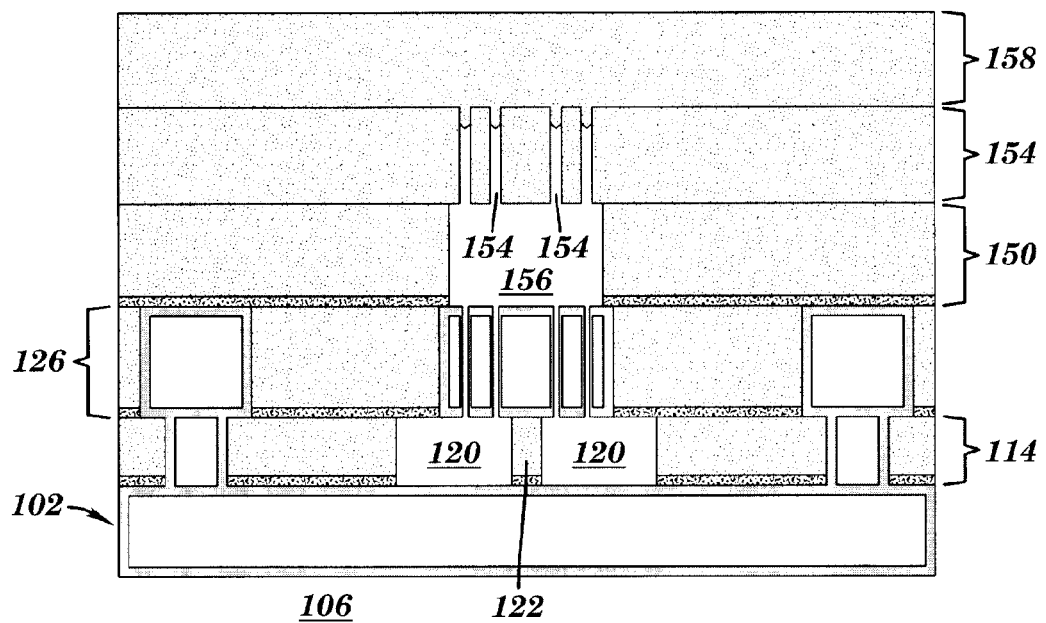

Subsequently, in FIG. 7(d), the etched areas are filled with more release material 148 as previously described (e.g., with SiLK® or DLC), and is then planarized. The same sacrificial material that was initially placed below is now reused, such that the release process removes all the layers of release material. FIG. 7(e) illustrates the addition of still another dielectric layer 152 atop layer 150 (collectively layers 142, 144), within which vias 154 are patterned and etched. These vias 154, which provide access to the release material 148, are then removed during the final steps of the integration scheme as shown in FIG. 7(f). Finally, FIG. 7(g) illustrates the final encapsulation step, which involves the deposition of another dielectric layer 158 that pinches off the small vias 154, thus hermetically sealing off the suspended transmission line structure.

Figure 8A:
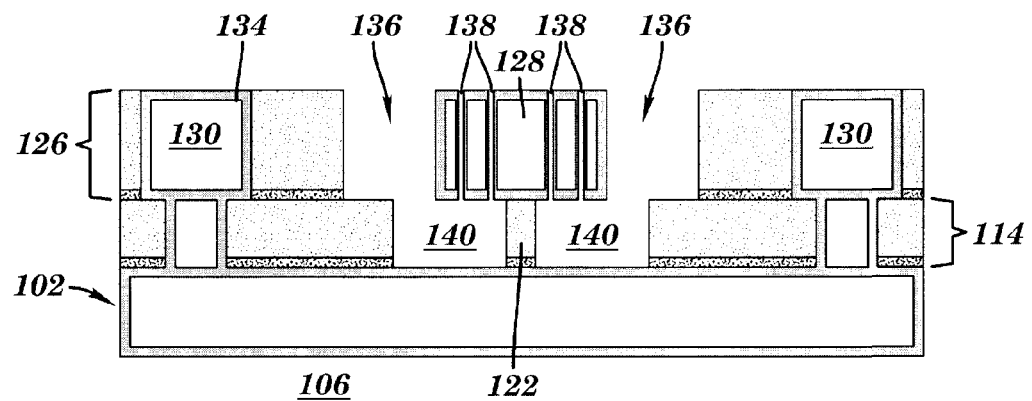
FIGS. 8(a) through 8(d) are a series of process flow diagrams illustrating an alternative method for encapsulating a suspended transmission line structure as formed in FIGS. 2(a) through 2(g), in accordance with an embodiment of the invention.
Figure 8B:
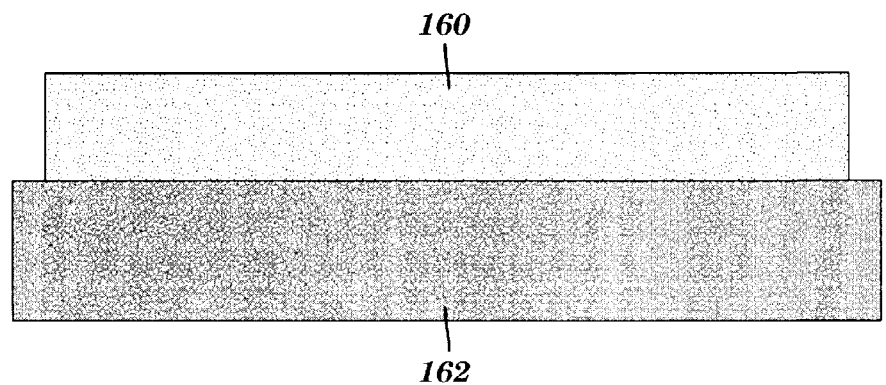
Figure 8C:
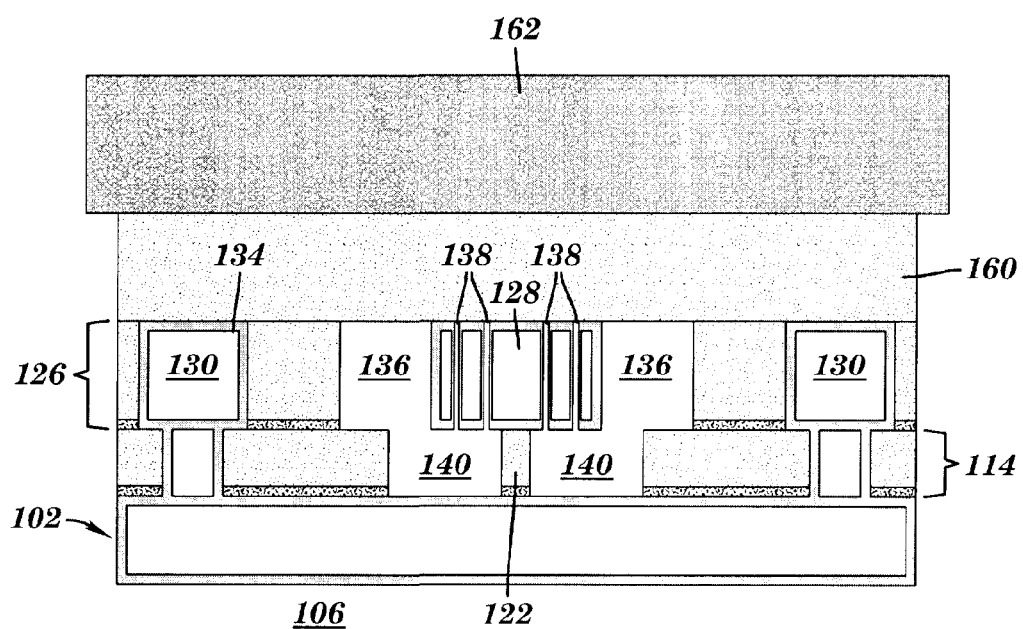

Referring now to FIGS. 8(a) through 8(d), there is shown still another alternative method for encapsulating the suspended transmission line structure, beginning from FIG. 2(i), wherein a carrier substrate is used for this encapsulation process. The carrier substrate may include, but is not limited to, $Al_2O_3$, glass, silicon etc. An inter-layer dielectric material 160 (for instance $SiO_2$), is deposited on such a carrier substrate 162, as shown in FIG. 8(b). The carrier substrate 162 is then bonded to the suspended transmission line structure, as shown in FIG. 8(c), using any one of a number of well known standard processes like low-temperature bonding, eutectic bonding, etc.

Figure 8D:
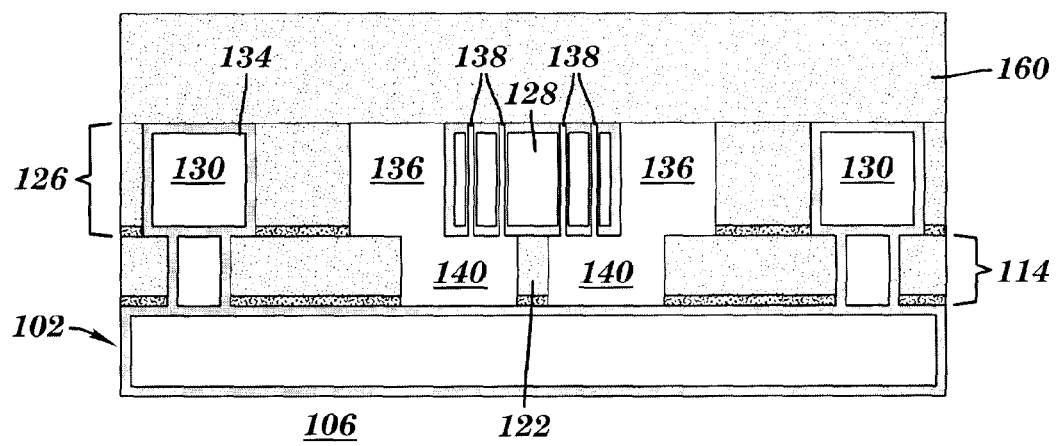

The carrier substrate 162 may then be removed using any of a number of processes such as wet etch, plasma etch, planarization, grinding, etc. In any case, the carrier removal process should be terminated on the ILD layer 160, as shown in FIG. 8(d). After this encapsulation process, standard BEOL processing may then be continued.

Figure 3:
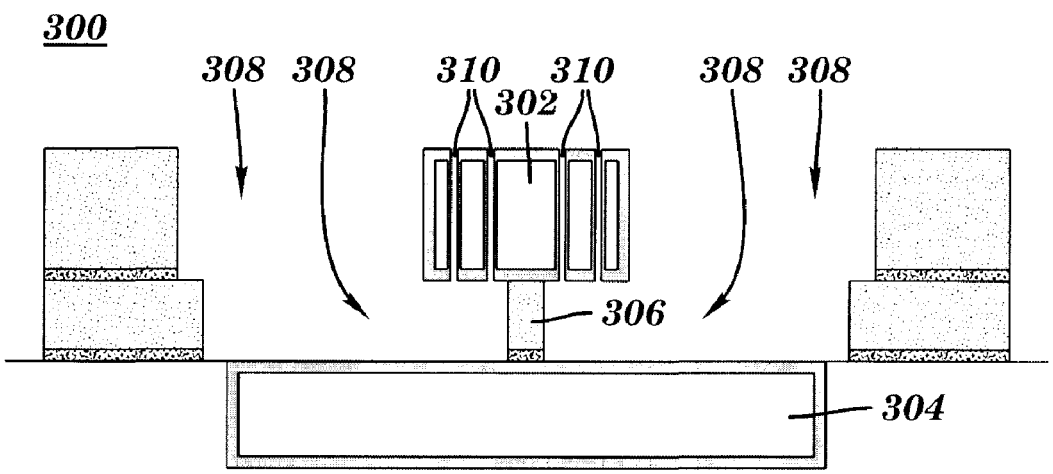
FIG. 3 is a cross sectional view of a microstrip transmission line embodiment having an air gap dielectric.
Figure 4:
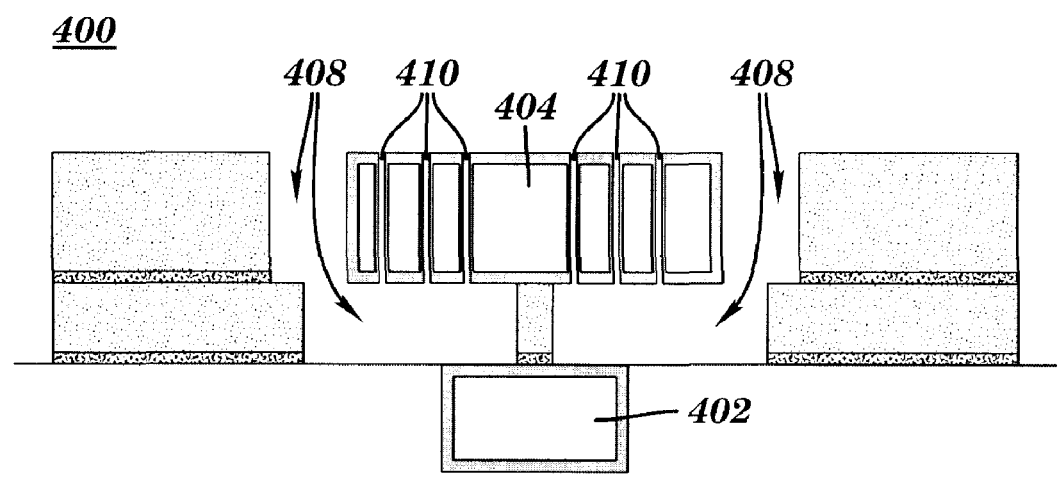
FIG. 4 is a cross sectional view of an inverted microstrip transmission line embodiment having an air gap dielectric.

In addition to a coplanar transmission line structure having a ground plane with air dielectric, it will be appreciated that the above described process may also be adapted to form other types of transmission line structures. For example, FIG. 3 illustrates a microstrip transmission line embodiment 300, including encapsulated signal transmission line 302, encapsulated ground plane 304, and support member 306. An air gap dielectric is further created by forming voids at both the ILD level and the signal line level, in a manner similar to that described above. Again, the signal transmission line 302 includes a plurality of access holes 310 for assisting in the release of sacrificial material to form the voids at the ILD level. FIG. 4 illustrates an inverted microstrip transmission line embodiment 400, in which the signal transmission line 402 is formed at a lower metallization level than the ground plane 404. Accordingly, to form voids 408 for the air gap dielectric, the access holes are first created in the ground plane 404 instead of the signal transmission line 402.

Figure 5:
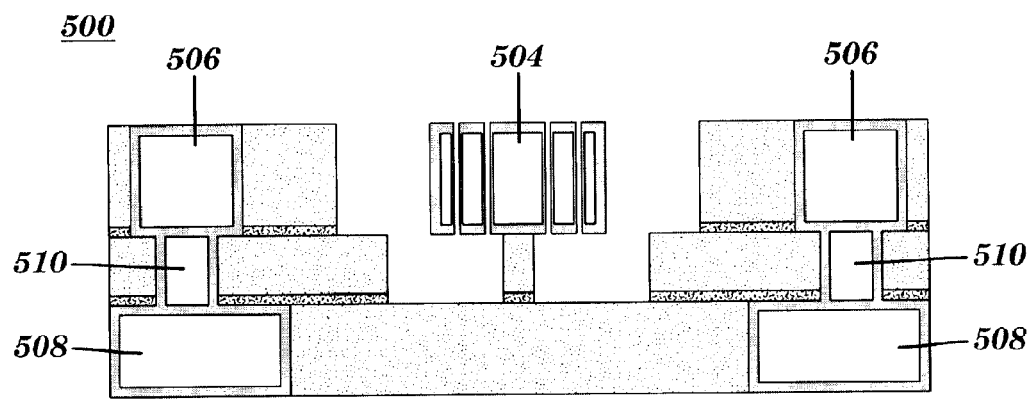
FIG. 5 is a cross sectional view of a coplanar transmission line embodiment having an air gap dielectric, and without a ground plane directly underneath the signal line.
Figure 6:
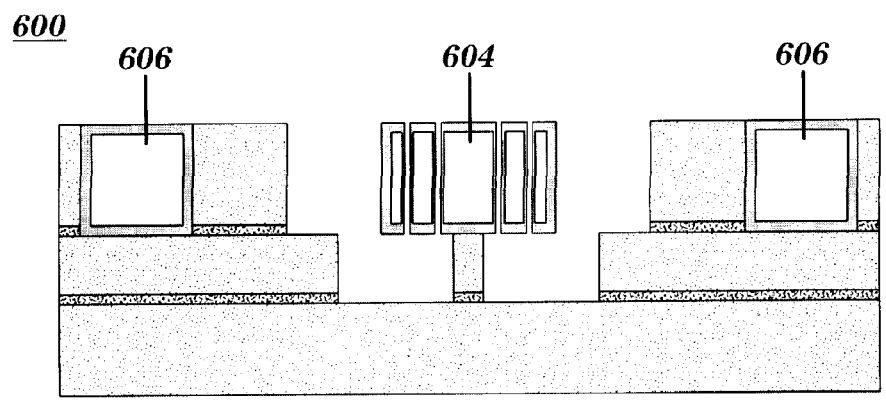
FIG. 6 is a cross sectional view of a coplanar waveguide transmission line embodiment having an air gap dielectric, and without any underlying ground plane.

Referring to FIG. 5, there is shown another coplanar transmission line embodiment 500, in which there is no ground plane formed directly underneath the signal transmission line 504. Instead, the coplanar shielding lines 506 are electrically isolated from one another, but are each coupled to respective lower level lines 508 through vias 510. FIG. 6 shows a coplanar waveguide structure 600, in which the ground plane only includes the two shielding lines 606 at the same level as the suspended signal line 604, with no connections to underlying metal levels.

Figure 9A:
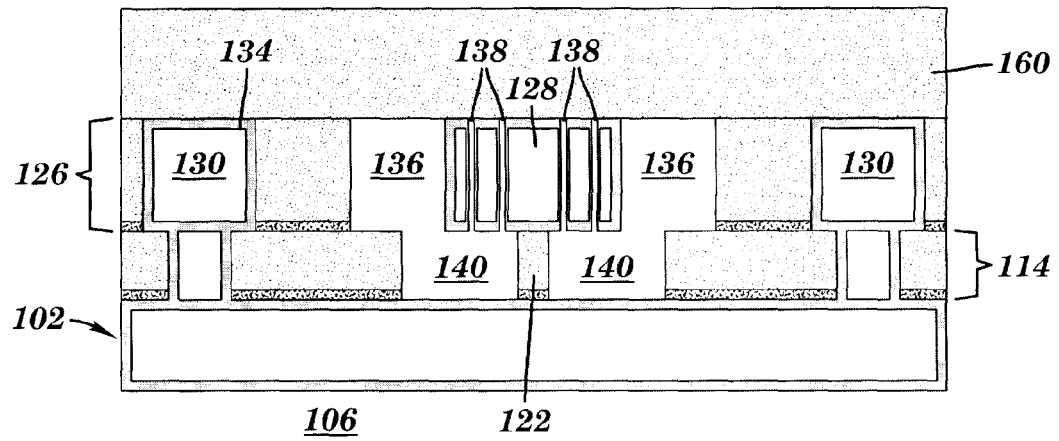
FIGS. 9(a) through 9(c) are a series of process flow diagrams illustrating the formation of a strip line transmission line embodiment having an air gap below the signal line, and with underlying and overlying ground planes.
Figure 9B:
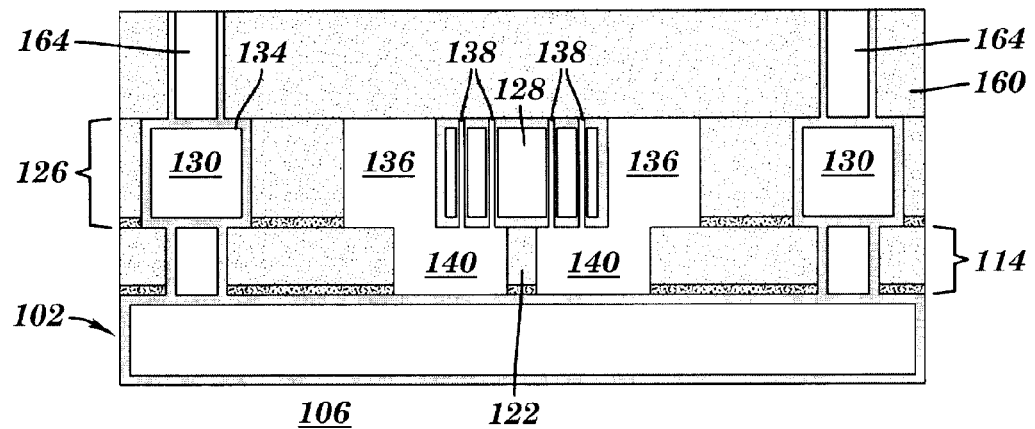
Figure 9C:
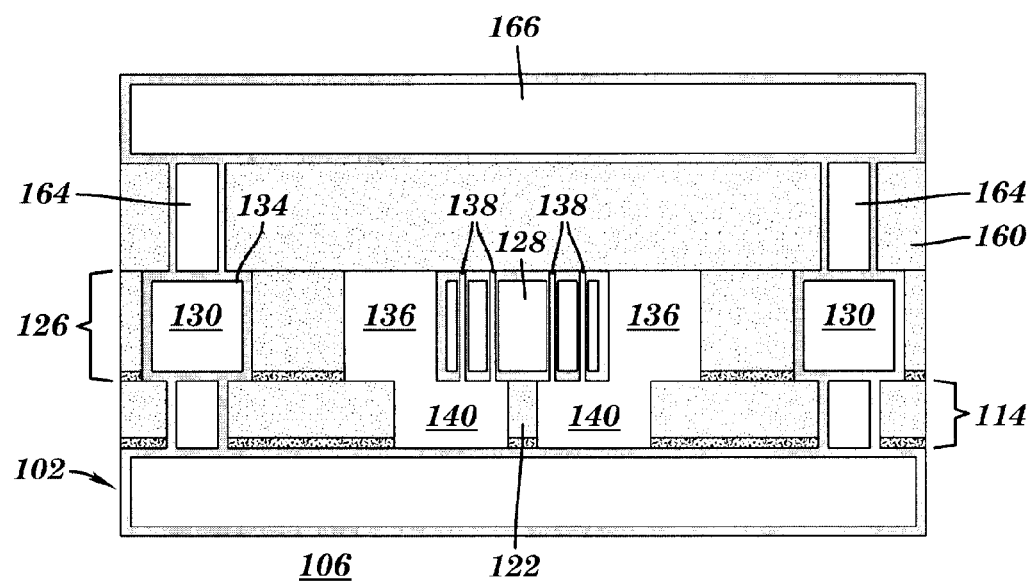

Still another embodiment of the suspended signal line topology is a stripline transmission line, as illustrated by the process flow drawings in FIGS. 9(a) through 9(c). Further BEOL processing is carried out on the structure generated at the end of the encapsulation process defined in FIGS. 8(a) through 8(d). In FIG. 9(b), via contacts 164 are fabricated using single damascene integration to make electrical contact with the two shielding lines 130. Then, in FIG. 9(c), a ground plane 166 is fabricated using single-damascene integration, although the via contacts 164 and ground plane 166 can also be fabricated using dual damascene integration processes as well.

In the transmission line embodiments including a ground plane, it will be appreciated that such a ground plane need not necessarily be located at the metallization level immediately below (or above) the signal transmission line level. In other words, the ground plane may be disposed at several levels below the signal transmission line, for example, to provide varying values of line impedance. If the structure is a coplanar transmission line that also features a ground plane, then the coplanar shielding lines can be electrically coupled to the ground plane through multiple levels of interconnect lines/vias.

Figure 10A:
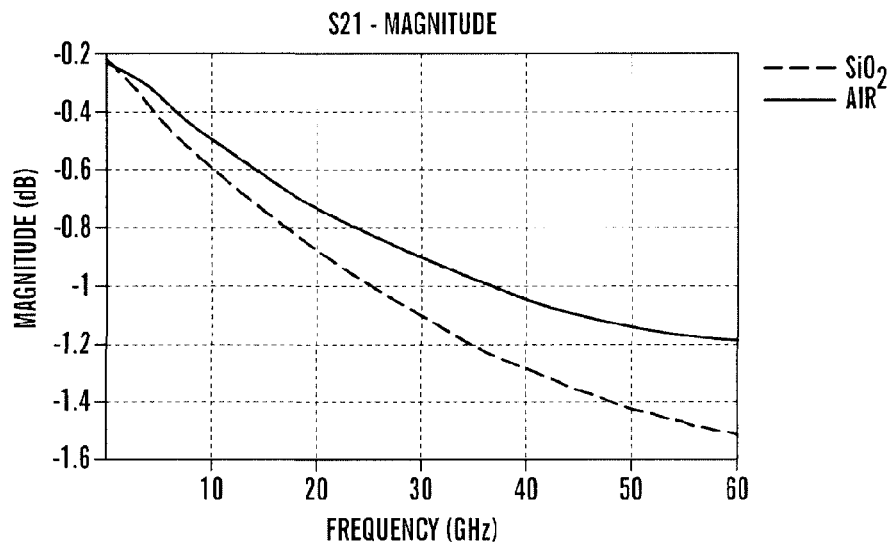
FIGS. 10(a) through 10(d) are graphs depicting various simulation results comparing a microstrip air gap transmission line structure (such as illustrated in FIG. 3) with a conventional microstrip structure with an $SiO_2$ dielectric.
Figure 10B:
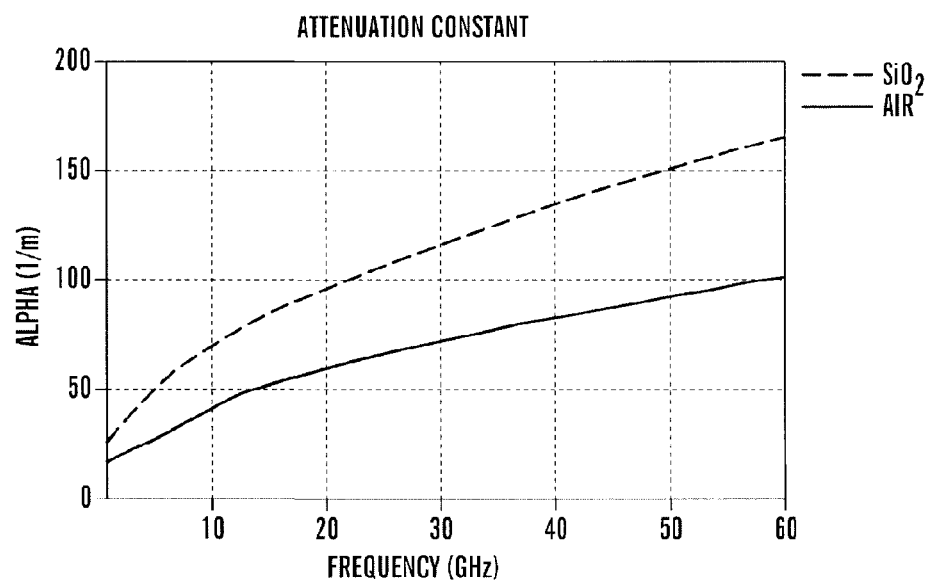
Figure 10C:
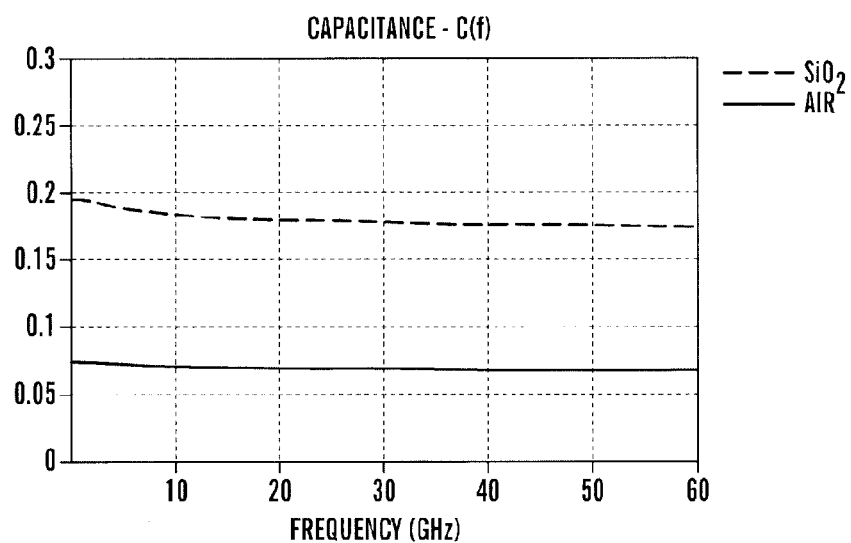
Figure 10D:
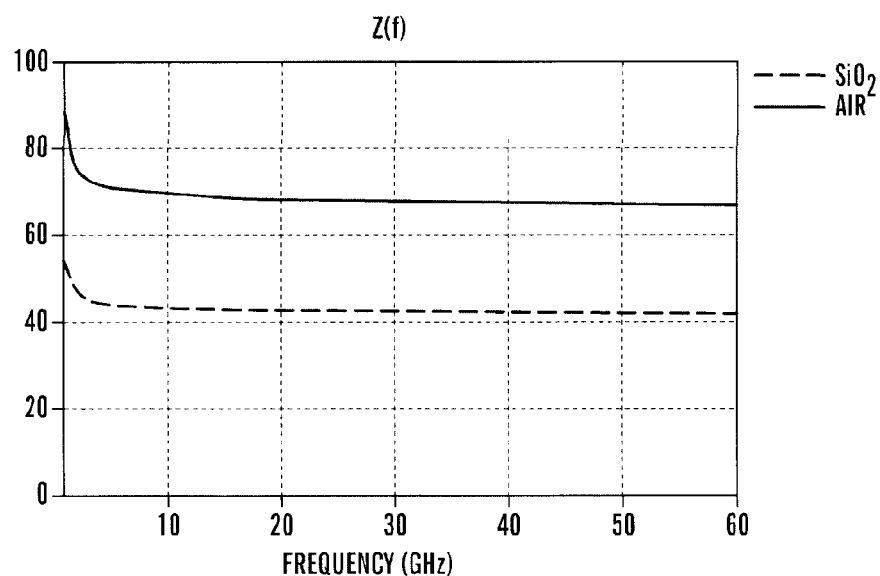

Finally, FIGS. 10(a) through 10(d) reflect various simulation results comparing a microstrip air gap transmission line structure (such as illustrated in FIG. 3) with a conventional microstrip structure with $SiO_2$ dielectric. As is shown in FIG. 10(a) and 10(b), a suspended interconnect has lower losses over a wide range of microwave frequencies, compared to the $SiO_2$ dielectric structure. In particular, the graph in FIG. 10(a) plots the magnitude versus frequency of the insertion loss (scattering parameter $S_{21}$), while FIG. 10(b) plots attenuation coefficient versus frequency. As is further shown in FIG. 10(c), the suspended interconnect structure also has a lower parasitic capacitance, as well as a higher impedance as shown in FIG. 10(d).

As will be appreciated, the above described transmission line structure embodiments provide for lower attenuation and reduced dielectric losses (that could ordinarily be high at RF/microwave frequencies) as a result of the air gap created between the signal line and the return path. Moreover, there is a reduced capacitive cross-talk voltage due to the decrease in effective interconnect dielectric constant that, in turn, lowers the signal propagation delay. Another advantage is the increased signal broadband width provided by an extended usable range of characteristic impedances. Signals with different frequency components travel with different speeds in a lossy interconnect, thus the dispersion is also lowered when using an air dielectric. Still a further advantage stems from simpler signal modeling from electromagnetic propagation that is mostly concentrated in air. From a structural standpoint, the transmission characteristics of air gap configuration are significantly less affected by semiconductor surface conditions and bulk substrate properties.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A back end of line microstrip transmission line structure, comprising:
   a signal transmission line formed on one metallization level;
   a ground plane formed on another metallization level;
   an air gap disposed between said signal transmission line and said ground plane, said air gap formed within an interlevel dielectric layer;
   one of said signal transmission line and said ground plane further comprising a plurality of access holes formed therethrough to provide removal access to a sacrificial material used to define said air gap, said plurality of access holes being arranged along a direction parallel to conductor edges of one of said signal transmission line and said ground plane; and
   a support structure disposed directly beneath said one of said signal transmission line and said ground plane having a plurality of access holes, said support structure; consisting of material entirely from said interlevel dielectric layer, and wherein a bottom surface of said support structure is in contact with the other of said signal transmission line and said ground plane.

2. The microstrip transmission line structure of claim 1, wherein said support structure further comprises a continuous rail.

3. The microstrip transmission line structure of claim 2, wherein said support structure further comprises a plurality of individual posts.

4. The microstrip transmission line structure of claim 3, wherein said signal transmission line and said ground plane further comprise a back end of line metallic material completely encapsulated within a liner material.

5. A back end of line coplanar waveguide transmission line structure, comprising:

a signal transmission line formed on a first metallization level;

a pair of coplanar shielding lines adjacent said signal transmission line in said first metallization level;

an air gap disposed beneath signal transmission line, said air gap formed within a first interlevel dielectric layer;

said signal transmission line further comprising a plurality of access holes formed therethrough to provide removal access to a sacrificial material used to define said air gap, said plurality of access holes being arranged along a direction parallel to conductor edges of said signal transmission line; and a support structure disposed directly beneath said signal transmission line, said support structure; consisting of material entirely from said first interlevel dielectric layer, and wherein a bottom surface of said support structure is in contact with a lower level interlevel dielectric layer with respect to said first interlevel dielectric layer.

6. The coplanar waveguide transmission line structure of claim 5, further comprising a first ground plane formed on a second metallization level.

7. The coplanar waveguide transmission line structure of claim 6, further comprising:

a second ground plane formed on a third metallization level;

said first metallization level disposed between said second metallization level and said third metallization level; and both of said first and said second ground planes electrically connected to said pair of coplanar shielding lines.

8. The coplanar waveguide transmission line structure of claim 5, wherein said support structure further comprises a continuous rail.

9. The coplanar waveguide transmission line structure of claim 5, wherein said support structure further comprises a plurality of individual posts.

* * * * *